(12) United States Patent
Cao et al.

(10) Patent No.: US 6,725,408 B1
(45) Date of Patent: Apr. 20, 2004

(54) BUILT-IN SELF-TEST FOR MULTI-CHANNEL TRANSCEIVERS WITHOUT DATA ALIGNMENT

(75) Inventors: Jun Cao, Irvine, CA (US); Afshin Momtaz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 426 days.

(21) Appl. No.: 09/632,666

(22) Filed: Aug. 7, 2000

Related U.S. Application Data

(60) Provisional application No. 60/148,416, filed on Aug. 11, 1999.

(51) Int. Cl.[7] .............................................. G06F 11/00
(52) U.S. Cl. .................................... 714/738; 714/742
(58) Field of Search ............................. 714/715, 882, 714/739, 716, 704, 742, 738, 732, 729, 728, 724; 370/249; 375/228

(56) References Cited

U.S. PATENT DOCUMENTS

| 3,824,597 | A | | 7/1974 | Berg |
| 5,146,486 | A | | 9/1992 | Lebowitz |
| 5,412,665 | A | * | 5/1995 | Gruodis et al. ............. 714/739 |
| 5,485,470 | A | * | 1/1996 | Yamada ...................... 714/716 |
| 6,094,459 | A | | 7/2000 | Kao et al. |

* cited by examiner

*Primary Examiner*—Albert Decady
*Assistant Examiner*—Mujtaba Chaudry
(74) *Attorney, Agent, or Firm*—Christie, Parker & Hale, LLP

(57) ABSTRACT

A method and device for testing multi-channel transceivers in an integrated circuit is provided. More specifically, the present invention relates to a method and device for implementing a built-in self-test for multi-channel transceivers. An exemplary embodiment of the present invention includes a test pattern generator, a multiplexer, a demultiplexer, and a test result evaluator. The test pattern generator generates a test pattern which is fed into each of the input channels of the multiplexer. The multiplexer multiplexes the data from all its input channels and then relays the data to the demultiplexer. The test result evaluator then individually checks the data at each of the output channels of the demultiplexer to determine whether the data received at each output channel is the same as the test pattern. In order to facilitate the checking process, signature analysis is utilized.

30 Claims, 6 Drawing Sheets

BUILT-IN SELF-TEST FOR MULTI-CHANNEL TRANSCEIVERS WITHOUT DATA ALIGNMENT

CROSS-REFERENCES TO RELATED APPLICATIONS

This application claims the benefit of priority under 35 U.S.C. §119 from U.S. Provisional Patent Application Serial No. 60/148,416 filed on Aug. 11, 1999, the disclosure of which is hereby incorporated by reference in its entirety for all purposes.

BACKGROUND OF THE INVENTION

The present invention generally relates to testing of transceivers. More specifically, the present invention relates to a method and device for implementing a built-in self-test for multi-channel transceivers.

In modern data networks, data are typically transmitted in high volume at a high transmission rate over long distances. Since the quality of the data signals degrades proportionally with the length of a transmission line, circuits known as tansmitter-receivers or transceivers are usually placed along a transmission line at certain predetermined locations to boost or rebroadcast the data signals to maintain their quality. Thus, due to the nature of their operation, transceivers need to be monitored and tested to ensure that the boosted data signals they produce are indeed accurate versions of the original signals.

FIG. 1 is a simplified block diagram showing a conventional transceiver circuitry which typically includes a clock/data recovery circuit 10, a demultiplexer 12 and a multiplexer 14. The testing of the transceiver is usually done in the following manner. External circuitry 8 produces a test signal as input to the multiplexer 14. The test signal is transmitted as a frame via multiple input channels 18 into the multiplexer 14. The test signal is then serialized by the multiplexer 14 and transmitted through a single multiplexer output channel 16 to the clock/data recovery circuit 10. The clock/data recovery circuit 10 recovers the test signal and feeds the recovered test signal into the demultiplexer 12. One function of the demultiplexer 12 is to parse the recovered data and direct them into various output channels 20 (i.e. deserialize the data stream). The collective output from these various output channels 20 is then checked by external circuitry 6 against the test signal to determine whether the transceiver is functioning properly.

During the course of transmission from the multiplexer 14 through the clock/data recovery circuit 10 to the demultiplexer 12, it is not unusual to have a collective shift in the test signal causing the relative position of the entire test signal to change without affecting the integrity of the test signal. In other words, the beginning of the test signal frame which is transmitted via one input channel of the multiplexer 14 may not always come out at precisely the corresponding output channel of the demultiplexer 12. For example, the beginning of the test signal frame transmitted via the first multiplexer input channel may not come out at the corresponding first demultiplexer output channel. Thus, while the contents or bits within the frame may have been transmitted correctly, a shift in the frame position may lead to an erroneous conclusion that the transceiver is malfunctioning. In order to avoid this situation, a "framer" circuit, which is commonly known in the art, is typically employed to accurately align or "frame" the initial test signal and the output received from the demultiplexer 12 before the two signals are compared.

Framer circuits that must keep track of signal timing for alignment purposes tend to be quite complex. Due to their complexity, such circuits are relatively expensive. Furthermore, such circuits typically occupy large silicon area and consume a relatively large amount of power rendering it difficult to have such circuit incorporated with a transceiver in an integrated circuit. Therefore, it would be desirable to provide a method and device for implementing a built-in self-test for multi-channel transceivers which is cost effective and capable of being integrated with a transceiver in an integrated circuit.

SUMMARY OF THE INVENTION

A method and device for testing multi-channel transceivers in an integrated circuit is provided. More specifically, the present invention relates to a method and device for implementing a built-in self-test for multi-channel transceivers. The present invention includes a test pattern generator, a multiplexer, a demultiplexer, and a test result evaluator. The test pattern generator generates a test pattern which is fed into each of the input channels of the multiplexer. In an exemplary embodiment, the test pattern generator is implemented using a linear feedback shift register. The linear feedback shift register is made to cycle through its various states and its parallel output is used to form a pseudo-random test pattern. This test pattern is uniquely represented by a signature which can be used later on to determine whether the transceiver is functioning properly.

The test pattern is fed to all the input channels of the multiplexer. The multiplexer multiplexes the data from all its input channels and then relays the data to the demultiplexer. The test result evaluator then individually checks the data at each of the output channels of the demultiplexer to determine whether the data received at each output channel is the same as the test pattern.

In order to facilitate the checking process, signature analysis is utilized. The test result evaluator first records the data stream coming out of each output channel of the demultiplexer at the appropriate time. The recording is initiated when a specific bit sequence is detected. The corresponding signature for the recorded data stream is then obtained. In an exemplary embodiment, a linear feedback shift register can be used to obtain the corresponding signature. Once the corresponding signature is obtained, it is compared to the signature of the test pattern. The comparison result then indicates whether each channel of the transceiver is working properly.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DESCRIPTION OF THE SPECIFIC EMBODIMENTS

Figure 1:
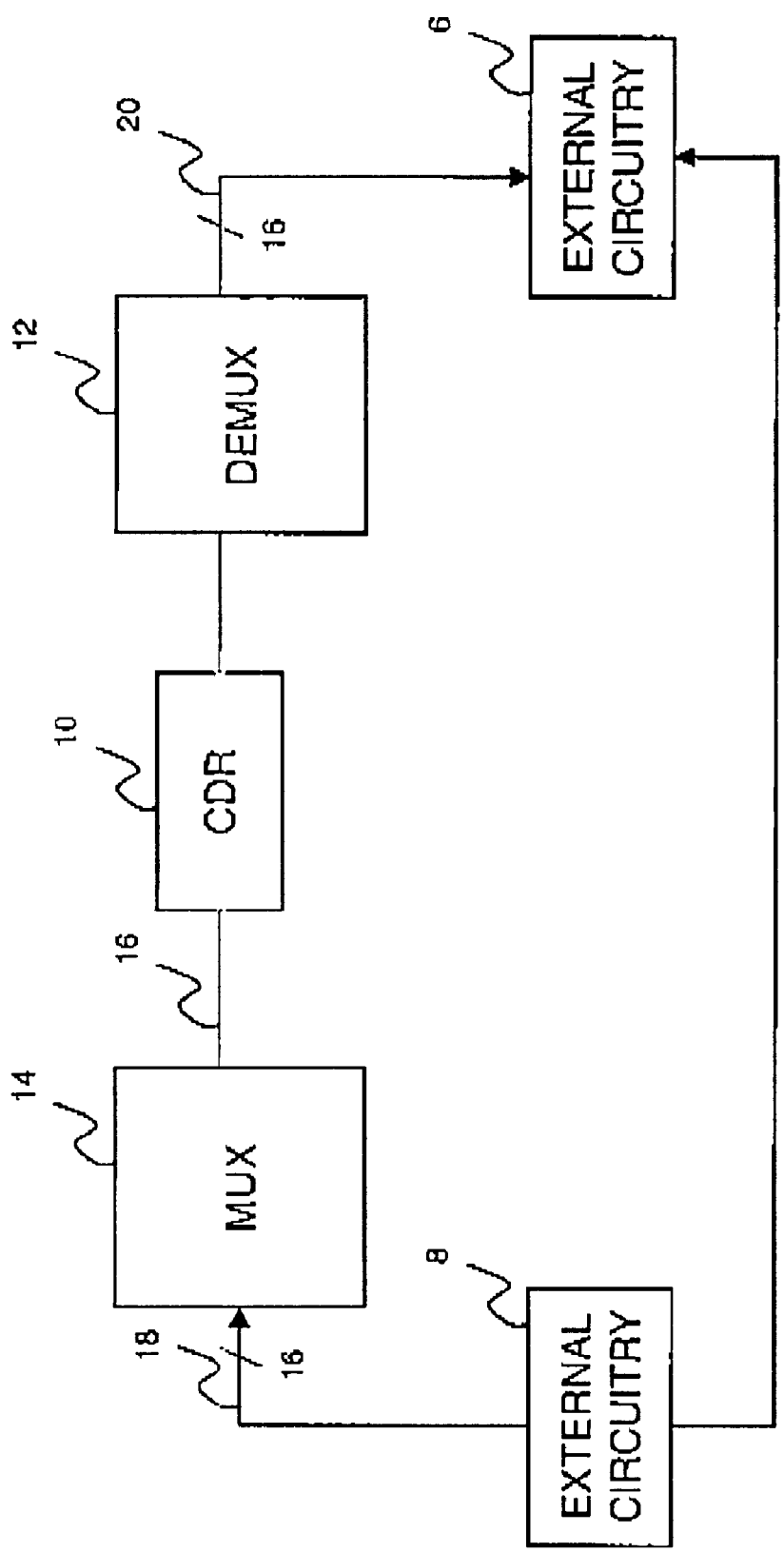
FIG. 1 is a simplified circuit block diagram showing a conventional testing configuration used to test the operation accuracy of a transceiver.
Figure 2:
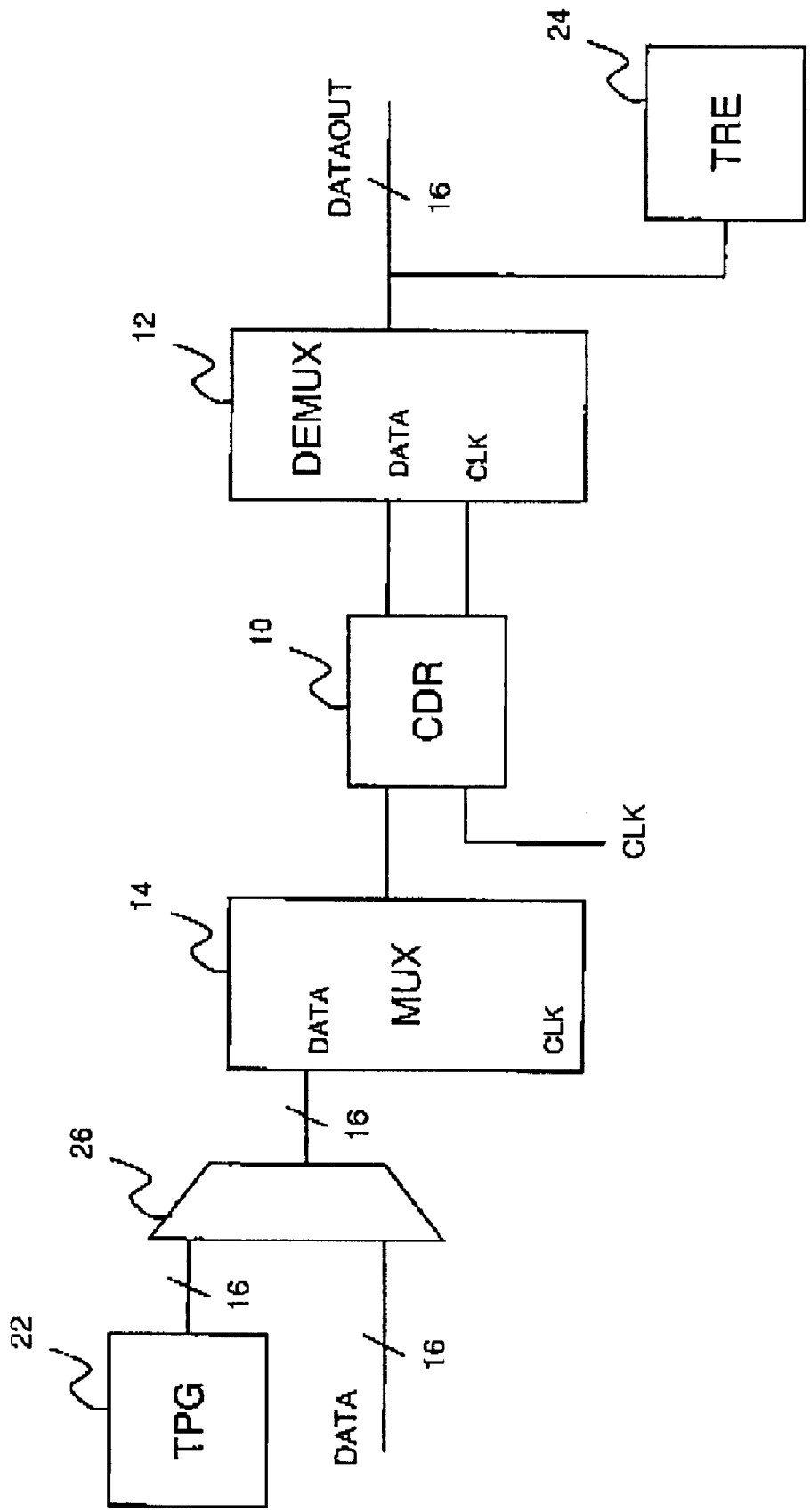
FIG. 2 is a simplified circuit block diagram showing one embodiment of the present invention.

The present invention will now he described in greater detail in connection with specific embodiments. FIG. 2 is a simplified circuit block diagram showing one embodiment of the present invention. This embodiment of the present invention includes a test pattern generator (TPG) 22, a multiplexer (MUX) 14, a clock/data recovery (CDR) circuit 10, a demultiplexer (DEMUX) 12 and a test result evaluator (TRE) 24.

As FIG. 2 shows, the TPG 22 is coupled to the MUX 14 via an input selector 26. The input selector 26 controls the type of signal (data or test signal) that is to be made available to the MUX 14. During testing mode, output from the TPG 22 is fed to the MUX 14 via the input selector 26 to allow testing to be performed. The TPG 22 is responsible for generating a test signal having a unique pattern that can be used as an input to the MUX 14. The MUX 14, in turn, is coupled to the CDR 10. Since the MUX 14 outputs its data at a high rate, it is desirable to have the CDR 10 receive the data from the MUX 14 so as to allow the data to be recovered. The CDR 10 then provides the recovered data as input to the DEMUX 12. The DEMUX 12 then feeds the recovered data into the TRE 24 for evaluation.

The general operation of the embodiment of the present invention as shown in FIG. 2 is now described in further details. The TPG 22 generates a pseudo-random test pattern which is fed into each input channel of the MUX 14. In an exemplary embodiment, the MUX 14 shown in FIG. 2 has sixteen (16) input channels and the pseudo-random test pattern generated by the TPG 22 is fed into each of these sixteen (16) input channels. The pseudo-random test pattern is then transmitted by the MUX 14 to the CDR 10 which, in turn, forwards the test pattern to the DEMUX 12. Output from each of the DEMUX output channels is then directed to the TRE 24 for evaluation to determine whether the test pattern generated by the TPG 22 is the same as that received at each of the DEMUX output channels. A match between the signal at an output channel of the DEMUX 12 and the test pattern generated by the TPG 22 indicates that the transceiver is performing its functions properly. By transmitting the same test pattern over the MUX input channels, each DEMUX output channel can be tested individually without the need to align or "frame" data from other DEMUX output channels.

In one embodiment, the TPG 22, whose primary function is to generate the pseudo-random test pattern, is implemented using a linear feedback shift register. A linear feedback shift register is an example of a general linear finite state machine, where the memory cells are made up of, e.g., D flip-flops and the next state operations are implemented using XOR logic functions. A linear feedback shift register of length n can be described by a polynomial with binary coefficients of up to degree n, where the nonzero coefficients of the polynomial denote the positions of the respective feedback connections. If the linear feedback shift register is initialized to a nonzero state, it cycles through a sequence of states and eventually comes back to the initial state in accordance with the next-state rules implemented by its polynomial description. The structure and function of a linear feedback shift register is commonly known in the art. By manipulating the parallel output of the linear feedback shift register, which will be explained further below, it is possible to generate a pseudo-random bit stream which can be used as a test pattern. Due to the specific polynomial description of a linear feedback shift register, a specific signature can be identified which uniquely corresponds to the pseudo-random bit stream.

Figure 3:
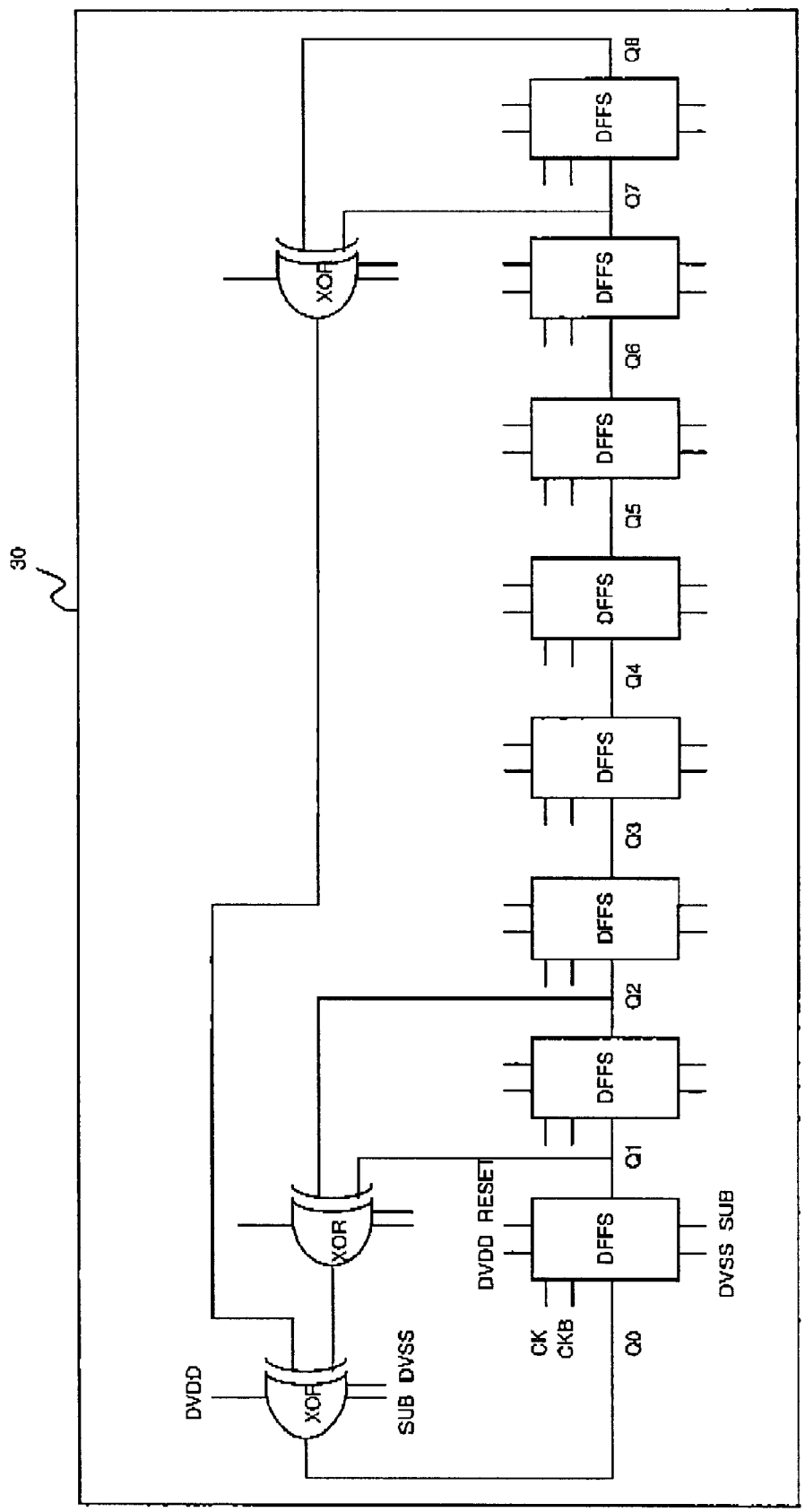
FIG. 3 is a simplified circuit block diagram showing one embodiment of the test pattern generator in accordance with the present invention.

In an exemplary embodiment as shown in FIG. 3 in accordance with the present invention, the linear feedback shift register 30 is 8-bit long. The pseudo-random test pattern that can be generated by the 8-bit linear feedback shift register 30 is as follows. By its nature of operation which is well-known in the art, the 8-bit linear feedback shift register 30 is capable of producing $2^8-1$, i.e., 255 nonzero states. Since the linear feedback shift register 30 is 8-bit long, its parallel output which represents a state at any particular instant is also 8-bit long. By duplicating the 8-bit parallel output and then concatenating the two 8-bit parallel outputs, a 16-bit sequence can be used as parallel input to the sixteen (16) input channels of the MUX 14. Preferably, the two 8-bit parallel outputs are concatenated and fed into the MUX 14 in such a way so as to minimize the possibility that two input channels which are multiplexed together have the same data. This is done to obtain a better test pattern for testing. Since the 8-bit linear feedback shift register 30 cycles through 255 nonzero states, a pseudo-random serial bit stream which repeats itself once every 255 bits is generated for each of the MUX input channels. In other words, a pseudo-random bit stream which is 255-bit long can be used as the test pattern.

Since an 8-bit linear feedback shift register 30 represents a polynomial with binary coefficients up to the $8^{th}$ degree, an 8-bit signature which uniquely corresponds to the 255-bit pseudo-random bit stream can be generated. It should be noted that by generating the test pattern for each MUX input channel in the manner described above, the same 8-bit signature corresponds to all the pseudo-random bit streams inputted into the MUX input channels. The generation of this 8-bit signature is commonly known in the art. By using this 8-bit signature as opposed to a 255-bit bit stream and using the same 8-bit signature to test the signals at all the DEMUX output channels, the cost of evaluating the DEMUX outputs can be significantly reduced.

It should be understood that the linear feedback shift register is merely an illustrative example and that a person of ordinary skill in the art will know of other ways and methods to implement circuitry or other logic functions that are capable of generating a pseudo-random bit stream that can be used as a test pattern.

Figure 4:
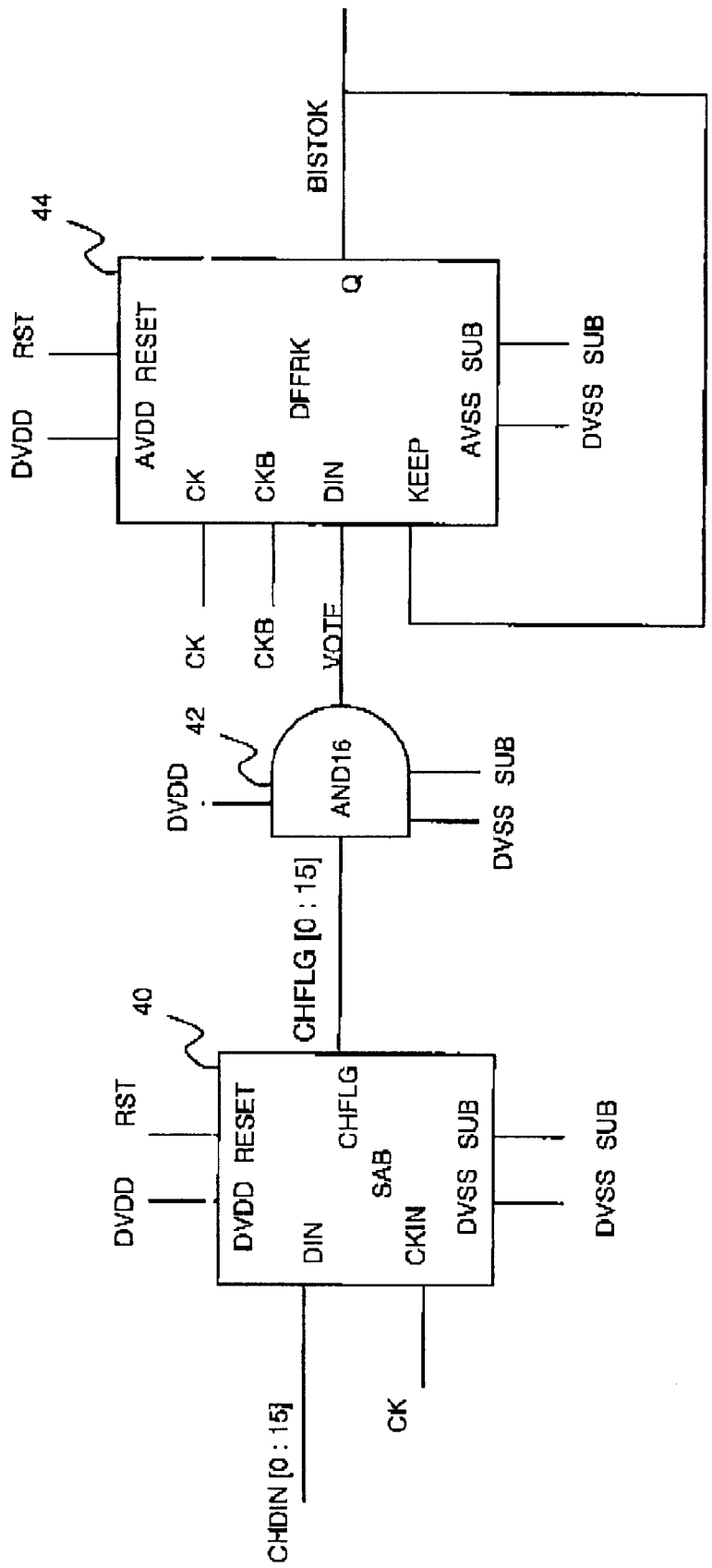
FIG. 4 is a simplified circuit block diagram showing one embodiment of the test result evaluator in accordance with the present invention.

As mentioned above, the test pattern is then transmitted via the MUX 14 and DEMUX 12 to the TRE 24. The TRE 24 examines the output received from the DEMUX 12 to determine whether it is the same as the test pattern initially generated by the TPG 22. FIG. 4 is a simplified block circuit diagram showing one embodiment of the TRE in accordance with the present invention. In this embodiment, the TRE 24 is made up of a signature analyzer 40, an AND logic function 42, and a flip-flop 44. The output channels of the DEMUX 12 are coupled to the signature analyzer 40. The outputs of the signature analyzer 40 are coupled to the AND logic function 42 which, in turn, is coupled to the flip-flop 44.

The TRE 24 generally operates in the following manner. The signature analyzer 40, which will be described in further detail below, serves to check the signature of the bit stream received from each of the DEMUX output channels. The bit stream from each of the DEMUX output channels is examined individually to determine whether it corresponds to the signature specific to the test pattern generated by the TPG 22. The results produced by the signature analyzer 40 are then fed into the AND logic function 42. The AND logic function 42 provides a compare function. By the nature of operation of the AND logic function 42, any non-uniformity amongst its inputs can be detected and then used to signify an exception condition. For example, if a high signal or logic "1" is used to indicate that there is a match between the bit stream of a DEMUX output channel and the test pattern, then a low signal or logic "0" produced by the AND logic function 42 would indicate that there is a mismatch or error amongst one or more of the DEMUX output channels. The result of the AND logic function 42 is then recorded for any future use using the flip-flop 44. Those skilled in the art appreciate that other logic functions, such as exclusive OR and the like can be employed to perform the compare function.

Figure 5:
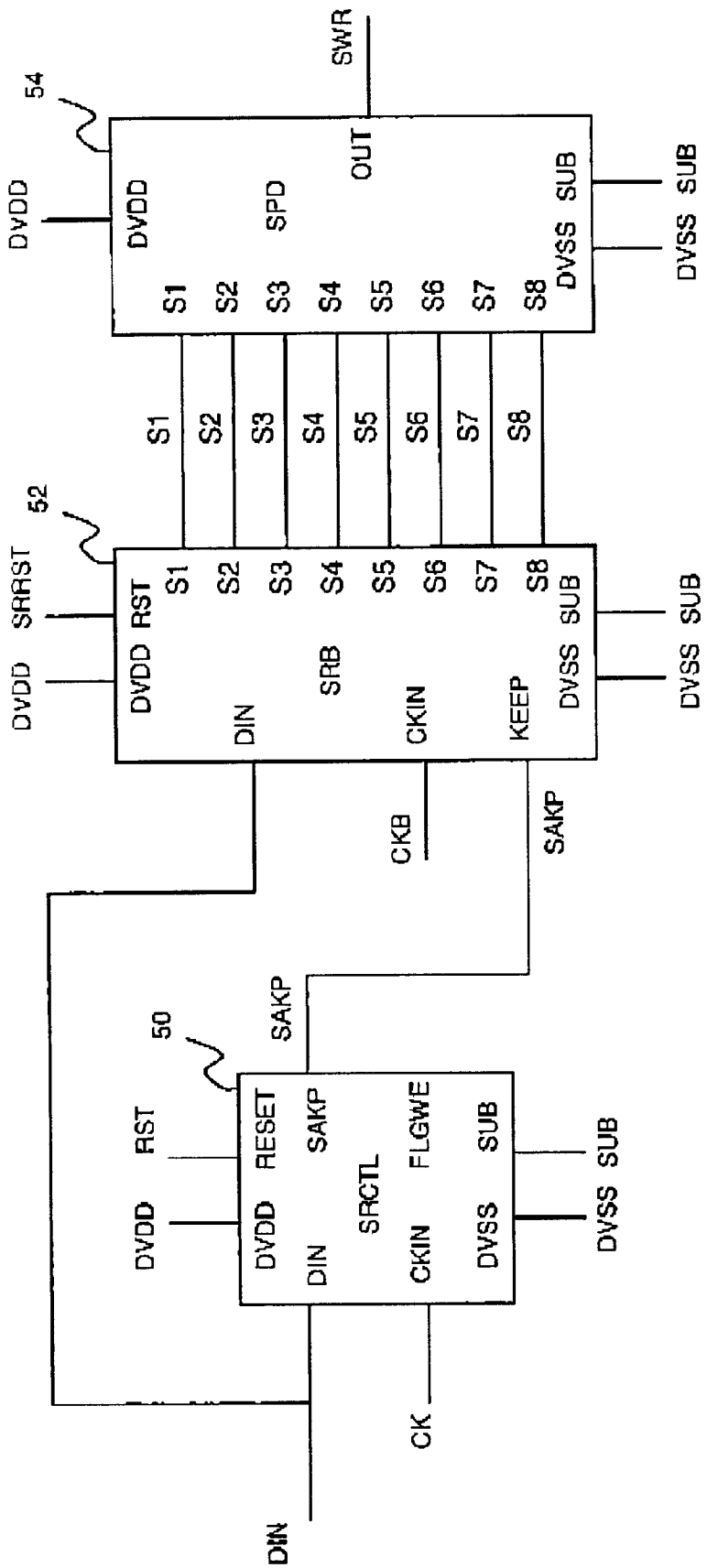
FIG. 5 is a simplified circuit block diagram showing one embodiment of the signature analyzer in accordance with the present invention.

FIG. 5 is a simplified circuit block diagram showing an exemplary embodiment of the signature analyzer 40 in accordance with the present invention. In this embodiment, the signature analyzer 40 is made up of three components, namely, a signature recorder controller 50, a signature recorder 52, and a signature comparator 54. As shown in FIG. 5, these three components are coupled to one another in a serial manner.

As its name implies, the main function of the signature recorder controller 50 is to control the operation of the signature recorder 52. More specifically, the signature recorder controller 50 controls when to record the bit stream coming from the DEMUX output channel and analyze the corresponding signature. In the case of using an 8-bit linear feedback shift register 30 as the TPG 22 to produce a test pattern, the signature recorder controller 50 controls when to record the 255-bit bit stream coming from a DEMUX output channel. To pinpoint the precise moment to start to record the bit stream received from a DEMUX output channel, the signature recorder controller 50 continually examines the bit stream looking for a unique bit sequence within the bit stream. For example, in the case of a 255-bit test pattern generated by an 8-bit linear feedback shift register 30, there is a unique bit sequence of seven consecutive 1's within the 255-bit test pattern. By identifying the unique sequence of seven consecutive 1's, the signature recorder controller 50 is able to precisely control the activation of the signature recorder 52 to record the appropriate bit stream.

Upon activation, the signature recorder 52 records the appropriate bit stream from a DEMUX output channel and generates a unique signature for that bit stream. In an exemplary embodiment, a linear feedback shift register can be used to implement the signature recorder 52. It should be noted that, given a bit stream which is identical to the test pattern, the signature recorder 52 must be able to generate a signature which is identical to the signature of the test pattern generated by the TPG 22 to permit any meaningful evaluation. For example, the signature recorder 52 can be an 8-bit linear feedback shift register. By serially feeding the 255-bit bit stream into the 8-bit linear feedback shift register, a unique signature, in form of a 8-bit bit pattern, for that particular 255-bit bit stream can be produced at the parallel output of the 8-bit linear feedback shift register.

Once the corresponding signature for the bit stream received from the DEMUX output channel is obtained by the signature recorder 52, it is then fed into the signature comparator 54 for comparison. The signature comparator 54 has available to it the unique signature of the test pattern originally generated by the TPG 22. The signature comparator 54 can then compare the unique signature of the test pattern to the corresponding signature produced by the signature recorder 52.

Since the bit stream from the DEMUX output channel is fed into the signature recorder 52 in a serial manner, i.e., one bit at a time, the signature recorder 52 does not produce the correct representative signature for the entire bit stream until all the bits in the bit stream have been read by the signature recorder 52. Hence, the signature comparator 54 only generates a meaningful result at periodic intervals. For the case of a 255-bit bit stream, the output of the signature comparator 54 only represents a meaningful comparison result every time 255 bits have been read by the signature recorder 52.

Figure 6:
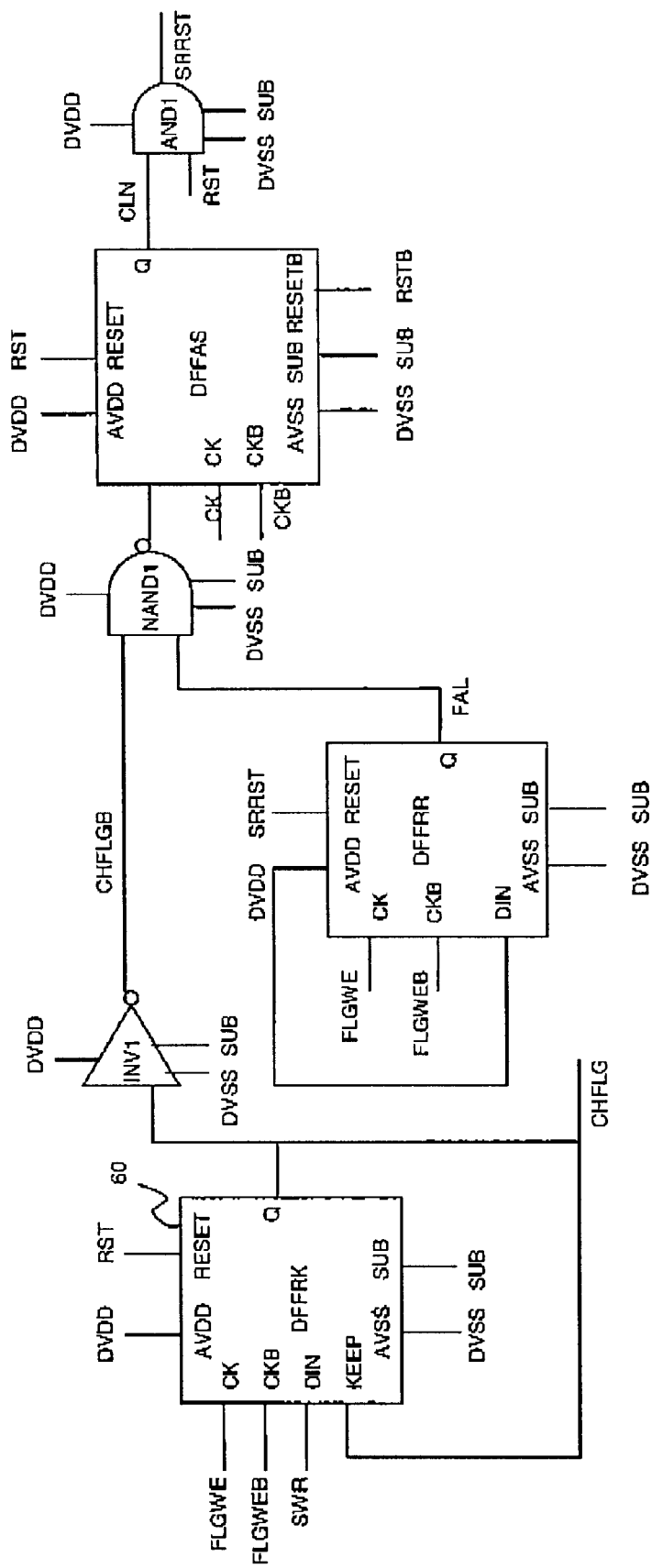
FIG. 6 is a simplified circuit block diagram showing one embodiment of a reset circuit capable of resetting the signature recorder in accordance with the present invention.

Since the output of the signature comparator 54 does not always represent a meaningful result, such output need to be examined at the precise moment. A flip-flop 60 can be used to record the output of the signature comparator 54 at the desired time. For example, the flip-flop 60 can record the output of the signature comparator 54 every 255 bits. The flip-flop 60 can then output the result it recorded to the AND logic function 42. After the output of the signature comparator 54 has been recorded, the signature recorder 52 can be reset for the next test cycle. FIG. 6 is a simplified circuit block diagram showing one embodiment of a reset circuit configured to reset the signature recorder 52 in accordance with the present invention. Based on the teaching and disclosure provided in FIG. 6, a person of ordinary skill in the art will appreciate the operations of the reset circuit. As can be seen from FIG. 6, when an error condition represented by signal "CHFLG" and received from the signature comparator 54 is present, the signature recorder 52 is not reset; otherwise, the signature recorder 52 is reset periodically.

While the signature analyzer 40, and its components thereof, have been described above with respect to a single DEMUX output channel, it should be understood that the signature analyzer 40 is capable of concurrently handling multiple bit streams emanating from the DEMUX output channels.

It should be further understood that the present invention as described above is capable of being implemented in an integrated circuit with other transceiver circuitry. The advantage of having the present invention integrated with other transceiver circuitry is that it provides a built-in self-test for a multi-channel transceiver. Such self-testing functionality eliminates the need for external testing equipment and further provides an efficient method to identify any problems within the integrated circuit.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A circuit for testing a transceiver, comprising:
   a test pattern generator configured to generate a plurality of test patterns, wherein the plurality of test patterns are associated with a signature;
   a multiplexer having a plurality of inputs and an output, each of said plurality of inputs receiving a corresponding test pattern;

a demultiplexer having an input and a plurality of outputs, said input being coupled to said output of said multiplexer; and a test result evaluation circuit configured to analyze a signal from one of said plurality of outputs of said demultiplexer using said signature to determine whether an error has occurred during transmission of said signal.

2. The circuit according to claim 1, wherein said test patter generator is a linear feedback shift register.

3. The circuit according to claim 1, wherein each of said plurality of test patterns is a pseudo-random bit sequence.

4. The circuit according to claim 1, further comprising:

a clock/data recovery circuit coupled between said multiplexer and demultiplexer and configured to recover data from said output of said multiplexer and relay said recovered data to said input of said demultiplexer.

5. The circuit according to claim 1, wherein said test result evaluation circuit further comprises:

a signature analyzer configured to analyze said signal using said signature;

a compare logic function coupled to said signature analyzer; and a result recorder configured to record a result of said compare logic function.

6. The circuit according to claim 5, wherein said compare logic function comprises an AND circuit.

7. The circuit according to claim 5, wherein said signature analyzer, further comprises:

a signature recorder controller configured to control when said signal is to be recorded;

a signature recorder configured to record said signal and generate a corresponding signature for said signal, said signature recorder being coupled to and controlled by said signature recorder controller; and a signature comparator configured to compare said corresponding signature of said signal with said signature associated with said plurality of test patterns.

8. The circuit according to claim 7, wherein said signature recorder is a linear feedback shift register.

9. The circuit according to claim 5, wherein said result recorder is a flip-flop.

10. The circuit according to claim 1, wherein said circuit and said transceiver are integrated into an integrated circuit.

11. The circuit of claim 1, wherein said test evaluation circuit is further configured to analyze two or more signals from two or more of said plurality of outputs of said demultiplexer respectively using said signature to determine whether one or more errors have occurred during transmission of said two or more signals.

12. The circuit of claim 1, wherein said test evaluation circuit is capable of using said signature to identify an error that has occurred in any of said plurality of outputs of said demultiplexer.

13. A circuit for testing a transceiver having a multiplexer and a de-multiplexer, said circuit comprising:

a test pattern generator configured to generate a plurality of test patterns and coupled to a plurality of inputs of said multiplexer, wherein each of the plurality of inputs receives a corresponding test pattern, and wherein the plurality of test patterns is associated with a signature, and a test result evaluation circuit configured to analyze a signal from one of a plurality of outputs of said de-multiplexer using said signature to determine whether an error has occurred during transmission of said signal;

wherein an output of said multiplexer is coupled to an input of said demultiplexer.

14. The circuit according to claim 13, wherein said circuit is incorporated with said transceiver.

15. The circuit according to claim 13, wherein said test pattern generator is a linear feedback shift register.

16. The circuit according to claim 13, wherein said test result evaluation circuit further comprises:

a signature recorder controller configured to control recording of said signal;

a signature recorder configured to record said signal and generate a corresponding signature based on said signal, said signature recorder being coupled to and controlled by said signature recorder controller; and a signature comparator configured to analyze said corresponding signature associated with said plurality of test patterns.

17. The circuit according to claim 16, wherein said signature recorder is a linear feedback shift register.

18. The circuit of claim 13, wherein said test evaluation circuit is further configured to analyze two or more signals from two or more of said plurality of outputs of said demultiplexer respectively using said signature to determine whether one or more errors have occurred during transmission of said two or more signals.

19. The circuit of claim 13, wherein said test evaluation circuit is capable of using said signature to identify an error that has occurred in any one of said plurality of outputs of said de-multiplexer.

20. A built-in self-testing circuit for testing an integrated circuit having a transceiver, comprising:

a test pattern generator configured to generate a plurality of test patterns, said plurality of test patterns being associated with a signature;

a multiplexer having a plurality of inputs and an output, said test pattern generator being coupled to said plurality of inputs, each of said plurality of inputs receiving a corresponding test pattern;

a demultiplexer having an input and a plurality of outputs, said input of said demultiplexer being coupled to said output of said multiplexer; and a test result evaluation circuit configured to receive said plurality of outputs of said demultiplexer and identify one or more of said plurality of outputs of said demultiplexer as having one or more errors using said signature.

21. The circuit according to claim 20, wherein said test pattern generator is a linear feedback shift register having parallel outputs.

22. The circuit according to claim 21, wherein said parallel outputs are respectively coupled to said plurality of inputs of said multiplexer.

23. The circuit according to claim 20, wherein said plurality of test patterns are fed respectively into each of said plurality of inputs of said multiplexer.

24. The circuit according to claim 20, wherein said test result evaluation circuit further comprises:

a signature analyzer configured to analyze signals emanating from said plurality of outputs of said demultiplexer;

an AND logic function coupled to said signature analyzer to determine whether any of corresponding signatures of said signals does not match said signature associated with said plurality of test patterns; and a result recorder configured to record a result of said AND logic function.

25. The circuit according to claim 24, wherein said signature analyzer further comprises:

a signature recorder controller configured to control recording of each of said signals;

a signature recorder configured to record each of said signals and generate a corresponding signature based on each of said signals, said signature recorder being coupled to and controlled by said signature recorder controller; and a signature comparator configured to compare each of said corresponding signatures of said signals with said signature associated within said plurality of test patterns.

26. The circuit according to claim 25, wherein said signature recorder is a linear feedback shift register.

27. The circuit according to claim 20, wherein said built-in self-testing circuit is integrated with said integrated circuit having a transceiver.

28. A method for testing an integrated circuit having a transceiver, said transceiver having a multiplexer coupled to a demultiplexer, said method comprising:

generating a plurality of test patterns, the plurality of test patterns being associated with a test signature;

receiving at each of the plurality of inputs of said multiplexer, a corresponding test pattern; and evaluating each of a plurality of outputs of said demultiplexer using said test signature to identify any error.

29. The method according to claim 28, wherein said steps are performed by circuitry within said integrated circuit having a transceiver.

30. The method according to claim 28, wherein said evaluating step further comprises:

recording an appropriate signal from each of said plurality of outputs of said demultiplexer;

identifying a corresponding signature for each of said appropriate signals; and comparing each of said corresponding signatures to said test signature.

* * * * *

UNITED STATES PATENT AND TRADEMARK OFFICE
CERTIFICATE OF CORRECTION

PATENT NO. : 6,725,408 B1
DATED : April 20, 2004
INVENTOR(S) : Cao et al.

It is certified that error appears in the above-identified patent and that said Letters Patent is hereby corrected as shown below:

Title page,
Item [57], ABSTRACT,
Line 5, delete "exemplaxy", insert -- exemplary --.

Column 7,
Line 10, delete "patter", insert -- pattern --.
Line 29, delete "analyzer, further", insert -- analyzer further --.
Line 61, delete "with a signature, and", insert -- with a signature; and --.
Line 65, delete "de-multiplexer", insert -- demultiplexer --.

Column 8,
Line 29, delete "de-multiplexer", insert -- demultiplexer --.

Signed and Sealed this

Thirteenth Day of September, 2005

JON W. DUDAS
*Director of the United States Patent and Trademark Office*